United States Patent
Lee

(10) Patent No.: US 8,521,105 B2
(45) Date of Patent: Aug. 27, 2013

(54) TRANSMITTER FOR TRANSMITTING A TRANSMISSION SIGNAL

(75) Inventor: Chao-Cheng Lee, Science-Based Industrial Park (TW)

(73) Assignee: Realtek Semiconductor Corp., Hsinchu (TW)

( * ) Notice: Subject to any disclaimer, the term of this patent is extended or adjusted under 35 U.S.C. 154(b) by 1542 days.

(21) Appl. No.: 11/727,101

(22) Filed: Mar. 23, 2007

(65) Prior Publication Data

US 2008/0058030 A1    Mar. 6, 2008

(30) Foreign Application Priority Data

Mar. 29, 2006  (TW) .............................. 95110848 A

(51) Int. Cl.
*H01Q 11/12* (2006.01)

(52) U.S. Cl.
USPC .......... 455/127.2; 330/106; 330/105; 455/91; 455/108; 455/127.1; 455/572; 455/574

(58) Field of Classification Search
USPC .......................... 330/285, 296, 278; 455/296
See application file for complete search history.

(56) References Cited

U.S. PATENT DOCUMENTS

| | | | |
|---|---|---|---|
| 5,142,168 A * | 8/1992 | Matsunaga | 326/90 |
| 6,873,703 B1 * | 3/2005 | Enriquez | 379/399.01 |
| 6,952,240 B2 * | 10/2005 | Gower et al. | 348/678 |
| 7,215,200 B1 * | 5/2007 | Hauser | 330/259 |
| 7,573,839 B2 * | 8/2009 | Kwan et al. | 370/286 |
| 2005/0231261 A1 * | 10/2005 | Chen | 327/333 |

* cited by examiner

*Primary Examiner* — Lewis West
*Assistant Examiner* — Richard Chan
(74) *Attorney, Agent, or Firm* — McClure, Qualey & Rodack, LLP

(57) ABSTRACT

A transmitter for transmitting a transmission signal is disclosed. The transmitter includes: a gain stage, for receiving an input signal and amplifying the input signal according to a gain to generate an amplified signal; and an output stage, coupled to the gain stage, for receiving a first reference voltage signal and the amplified signal and utilizing the first reference voltage signal to perform a predetermined operation on the amplified signal to generate the output signal.

6 Claims, 4 Drawing Sheets

TRANSMITTER FOR TRANSMITTING A TRANSMISSION SIGNAL

BACKGROUND OF THE INVENTION

1. Field of the Invention

The present invention relates to a transmitter, and more particularly, to a transmitter having low power consumption.

2. Description of the Related Art

In the field of signal transmissions, in order to allow the signal to be successfully transferred from a transmitter to a receiver, the impedance matching should be considered when the transmitter and the receiver are being designed. In other words, the impedances of the transmitter and the receiver are designed to match the characteristic impedance of the transmission medium (ex: cable).

FIG. 1 shows a block diagram of a transmission system according to the prior art. As shown in FIG. 1, assume that the equivalent impedance of the transmission medium 110 is R. Therefore, the impedances of the transmitter 100 and the receiver 120, which correspond to the transmission medium side, are substantially equal to the impedance R of the transmission medium. This helps prevent the transmission signal from reflection, and optimizes the transmission efficiency (that is, the voltage level Va of the node A is substantially equal to the voltage level Vb of the node B).

As is known, a conventional transmitter can be divided into two types of transmitters, the current-mode transmitter and the voltage-mode transmitter. Please refer to FIG. 2, which is a diagram showing a current-mode transmitter 200 and a receiver 220. Here, assume that the impedance of the transmission medium 210 is R. Therefore, for the purpose of impedance matching, the equivalent input impedance Rb of the receiver 220 is equal to R. When the signal is being transferred, the voltage level Va of the node A is equal to the voltage level Vb of the node B. At this time, for the transmitter 200, the impedance of the input impedance Ra is also equal to R. Therefore, the current outputted from the transmitter 200 is 2Vb(t)/R. Furthermore, in order to make sure that the current can be definitely outputted, the working voltage Vdd of the transmitter 200 must be larger or equal to the maximum of Vb(t). Therefore, the power consumption of the entire transmitter 200 can be represented by the following equation (1):

$$\text{Power consumption} \geq Vb(t)_{max} * 2Vb(t)/R \qquad \text{equation (1)}$$

Please refer to FIG. 3, which is a diagram showing a voltage-mode transmitter 300 and a receiver 320. Similarly, the equivalent input impedance Rb of the receiver 320 is equal to the impedance R of the transmission medium. The voltage level Va of the node A is equal to the voltage level Vb of the node B. At this time, for the transmitter 300, the impedance of the input impedance Ra is equal to R. Therefore, the current outputted form the transmitter is Vb(t)/R. For the node C, the voltage level Vc(t) of the node C is equal to 2Vb(t). Therefore, in order to make sure that the current of the transmitter 300 can be outputted. The working voltage Vdd of the transmitter 300 should be larger or equal to the maximum of 2Vb(t). And the power consumption of the transmitter 300 can be represented by the following equation (2):

$$\text{Power consumption} \geq 2Vb(t)_{max} * Vb(t)/R \qquad \text{equation (2)}$$

Obviously, when the current-mode transmitter is utilized, the needed current is larger, but needed working voltage is lower. On the other hand, when the voltage-mode transmitter is utilized, the needed working voltage is larger, but the needed current is lower. Please refer to equations (1) and (2), it is easily seen that regardless that the of whether above-mentioned current-mode transmitter and voltage-mode transmitter are utilized, the lowest power consumptions of the current-mode transmitter and voltage-mode transmitter are both equal to $2Vb(t)_{max} * Vb(t)/R$, which needs to be reduced.

SUMMARY OF THE INVENTION

It is therefore one of the objectives of the claimed invention to provide a transmitter to solve the above-mentioned problems.

It is therefore one of the objectives of the claimed invention to provide a transmitter to reduce the power consumption.

According to an exemplary embodiment of the present invention, a transmitter for transferring a transmission signal through a transmission medium is disclosed. The transmitter comprises: a gain stage, for receiving an input signal and generating a first signal according to the input signal; and an output stage for receiving the first signal and outputting the transmission signal according to the first signal, wherein the output stage operates according to a first working voltage; wherein a voltage level of the first working voltage is less than twice of the maximum of the transmission signal.

These and other objectives of the claimed invention will no doubt become obvious to those of ordinary skill in the art after reading the following detailed description of the preferred embodiment that is illustrated in the various figures and drawings.

DETAILED DESCRIPTION OF THE INVENTION

Figure 1:
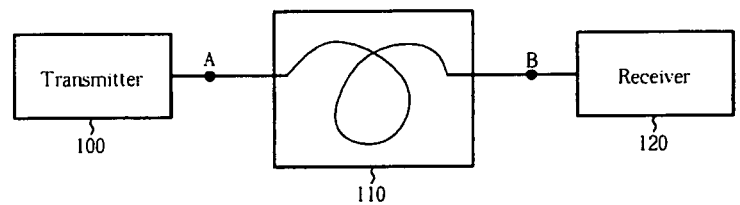
FIG. 1 is a block diagram of a transmission system according to the prior art.
Figure 2:
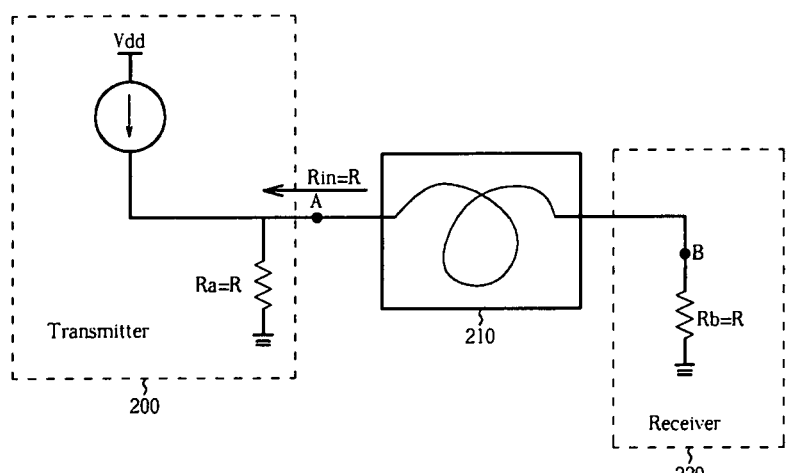
FIG. 2 is a diagram of a current-mode transmitter according to the prior art.
Figure 3:
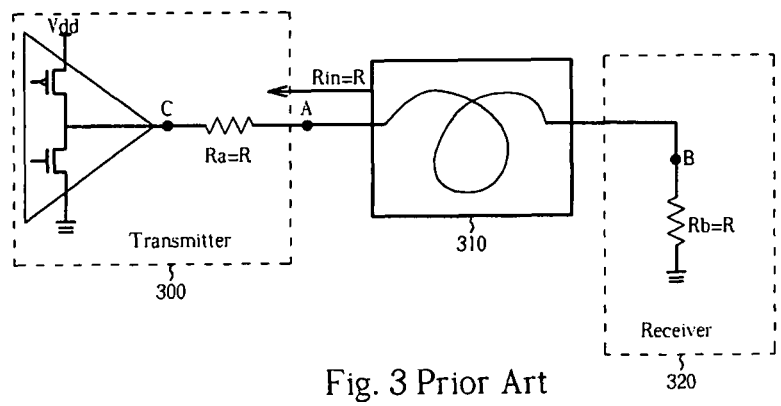
FIG. 3 is a diagram of a voltage-mode transmitter according to the prior art.
Figure 4:
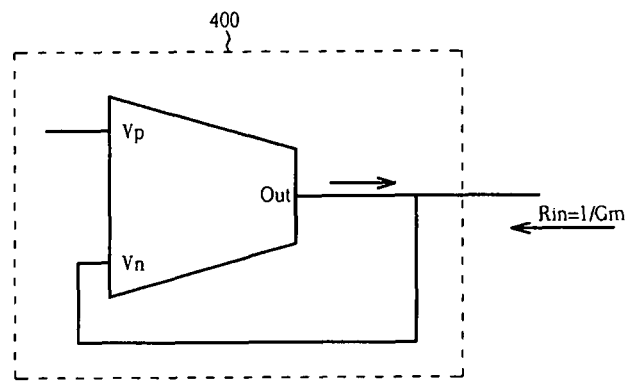
FIG. 4 is a simplified diagram of a transconductance circuit.

Before the structure of the present invention transmitter is disclosed, please refer to FIG. 4 first. FIG. 4 is a simplified diagram of a transconductance cell 400. For the transconductance circuit 400, the relationship between the output current and the input voltage can be represented as the following equation (3):

$$I(\text{out}) = Gm * (Vp - Vn) \qquad \text{equation (3)}$$

Therefore, as shown in FIG. 4, when the output end of the transconductance cell 400 is coupled to the negative input end of the transconductance cell 400, a feedback circuit is formed. The impedance of transconductance cell 400, which corresponds to the input end is equal to 1/Gm.

Figure 5:
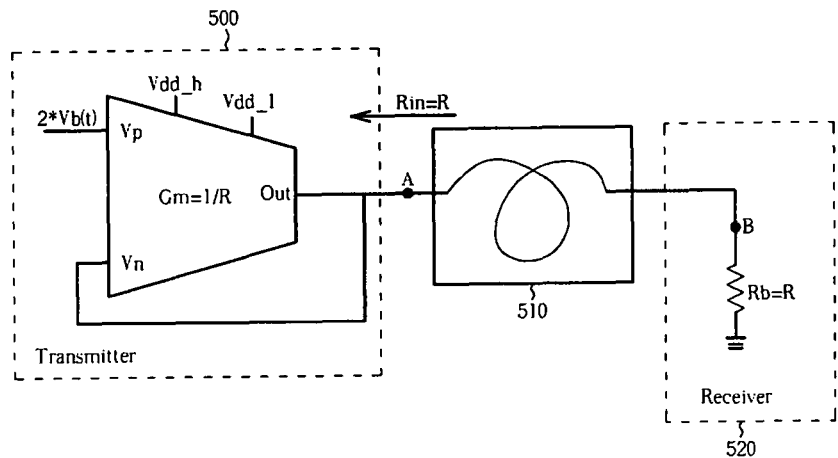
FIG. 5 is a diagram of a transmitter according to the present invention.

Please refer to FIG. 5, which is a diagram of a transmitter 500 according to the present invention. In this embodiment, the impedance of the transmission medium 510 is also assumed as R. Furthermore, in order to achieve the purpose of impedance matching, the input impedance of the receiver 520 is also adjusted as R. Please note that, as shown in FIG. 5, the present invention transmitter 500 is implemented as the above-mentioned transconductance cell structure.

Obviously, in order to achieve the purpose of impedance matching, the transconductance Gm of the transmitter 500 should be equal to 1/R. Furthermore, in this embodiment, assume that the signal transferred to the receiver 520 is Vb(t). For the node B, the current flowing through the node B is equal to Vb(t)/R. Obviously, the output current of the transmitter 500 is also equal to Vb(t)/R. In addition, as mentioned previously, the voltage level Va of the node A is equal to the voltage level Vb(t). According to the equation (3), it can be figured out that the needed input signal Vp of the transmitter 500 substantially corresponds to 2Vb(t).

Figure 6:
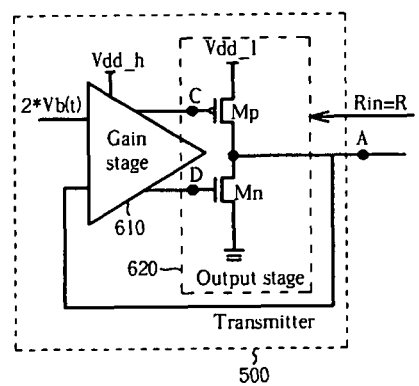
FIG. 6 is a diagram showing an embodiment of the transmitter shown in FIG. 5.

In one embodiment, the present invention transmitter 500 utilizes two working voltages (shown as a high working voltage Vdd_h and a low working voltage Vdd_l) to reduce to the power consumption of the transmitter 500. For example, please refer to FIG. 6, which is a diagram of an embodiment of the transmitter 500 shown in FIG. 5. As shown in FIG. 6, the transmitter 500, which is implemented by utilizing transconductance circuit, can be divided into a gain stage 610 and an output stage 620. The gain stage 610 utilizes the working voltage Vdd_h to operate such that the gain stage 610 can perform a gain operation (for example, to amplify) on the input signal 2Vb(t), and the processed signal is outputted to the node C and the node D. In addition, the output stage 620 operates by utilizing another working voltage Vdd_l. The output stage 620 comprises two transistors Mp and Mn for receiving the signal from the nodes C and D outputted by the gain stage 610. Obviously, because the gate voltage of the transistors Mp and Mn are controlled by the output signal of the gain stage 610, the current outputted by the output stage 620 is also controlled by the output signal of the gain stage 610 according to the characteristics of the transistors Mp and Mn. As known by those skill in the art, as long as the parameters (here, the parameter can include the characteristics of the transistors Mp and Mn and the output voltage of the gain stage) are well defined, the current outputted by the transmitter 500 can be under control as Vb(t)/R. In this way, the voltage level Vb(t) can be established in the receiver 510 such that the purpose of transmitting signals can be achieved.

Please note that, the gain stage 610 and the output stage 620 utilize different working voltages (it means that the working voltages have different voltage levels, for example, as mentioned previously, they can correspond to a high working voltage and a low working voltage). As is known, the output stage 620 should output the transmission signal and therefore expends more power. On the other hand, because the current of the gain stage 610 can be designed as a very small current value, the power consumption of the gain stage 610 is much smaller than that of the output stage 620. In other words, the main power consumption of the transmitter 500 is spent by the output stage 620. However, the present invention output stage 620 utilizes a lower working voltage Vdd_l to operate. Therefore, the power consumption of the entire transmitter is also smaller.

In this embodiment, for the working voltage Vdd_h, the working voltage Vdd_h should be large enough to allow the gain stage to work normally. But on the other hand, the voltage level of the output stage 620 is Vb(t). Therefore, the working voltage Vdd_l should be larger than or equal to the maximum voltage level $Vb(t)_{max}$ of the node A. In addition, the current outputted by the output stage 620 is Vb(t)/R. That is, the working voltage Vdd_l should be as low as possible but cannot be lower than the maximum voltage Vb(t)max of the node A such that the power consumption can be reduced. Therefore, in this embodiment, the working voltages Vdd_h and Vdd_l are not the same.

The power consumption of the output stage 620 can be represented as the following equation (4):

$$\text{Power consumption} = Vb(t)_{max} * (Vb(t)/R) \qquad \text{equation (4)}$$

As mentioned previously, most of the power consumption is consumed by the output stage 520. Therefore, the power consumption of the transmitter 500 is about Vb(t).sub.max*(Vb(t)/R). In contrast to the prior art transmitter, as shown in equation (4), the transmitter 500 only has half power consumption.

Please note that, the present invention does not limit the voltage level of the working voltage Vdd_h, and the working voltage Vdd_h can be set as low as possible as long as the gain stage 610 can operate normally. Moreover, the present invention does not limit the voltage level of the working voltage Vdd_l. As mentioned previously, the working voltage Vdd_l only needs to be larger than or equal to the maximum $Vb(t)_{max}$ of the transmission signal such that the power consumption of the transmitter 500 can be reduced.

In addition, please note that, the present invention does not limit the implementations of the gain stage 610 and the output stage 620, The circuit designer can change the inner circuits of the transmitter 500 according to different demands. For example, in the above-mentioned embodiment, the transmitter 500 is a single-ended circuit, but in the actual implementation, the transmitter 500 can also be a differential circuit.

Figure 7:
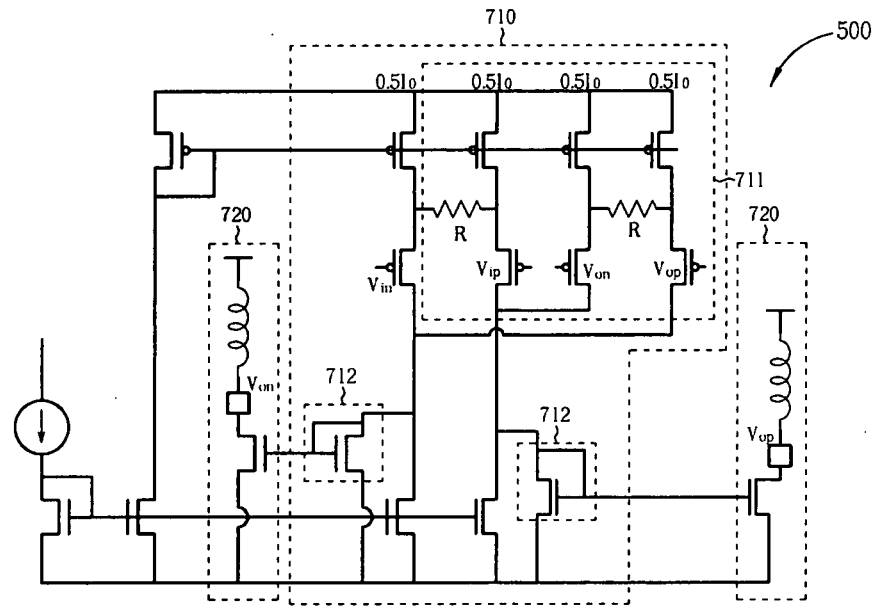
FIG. 7 is a diagram showing another embodiment of a transmitter according to the present invention.

Please refer to FIG. 7, which is a diagram showing detailed circuits of a transmitter 500 of another embodiment according to the present invention. As shown in FIG. 7, the transmitter 500 is implemented as a differential circuit, which comprises a gain stage 710 and an output stage 720, also. The gain stage 710 comprises a transconductance cell 711 and an impedance device 712. As mentioned previously, the transconductance cell 711 can perform a transconductance operation on the received input signal Vip and Vin. In addition, the differential circuit, which is in the right side of the transconductance cell 711, corresponds to the feedback circuit shown in FIG. 4. In this embodiment, the impedance device 712 transforms the current signal outputted by the transconductance cell 711 into a voltage signal, which is used to control the gates of the transistors of the output stage 720. Therefore, needed output current Vb(t)/R can be outputted. Please note, the impedance device 712 can be implemented by a transistor.

In this embodiment, the needed working voltage of the output stage 720 only has to be larger than or equal to $Vb(t)_{max}$ such that the transmitter 500 can have low power consumption.

Please note that, the impedance device 712 is an optional device. As is known, as long as the working voltage can be set appropriately, the impedance device 712 is no longer utilized. That is, the output of the transconductance cell 711 can be directly utilized to drive the output stage 720. This change also follows the spirit of the present invention.

Figure 8:
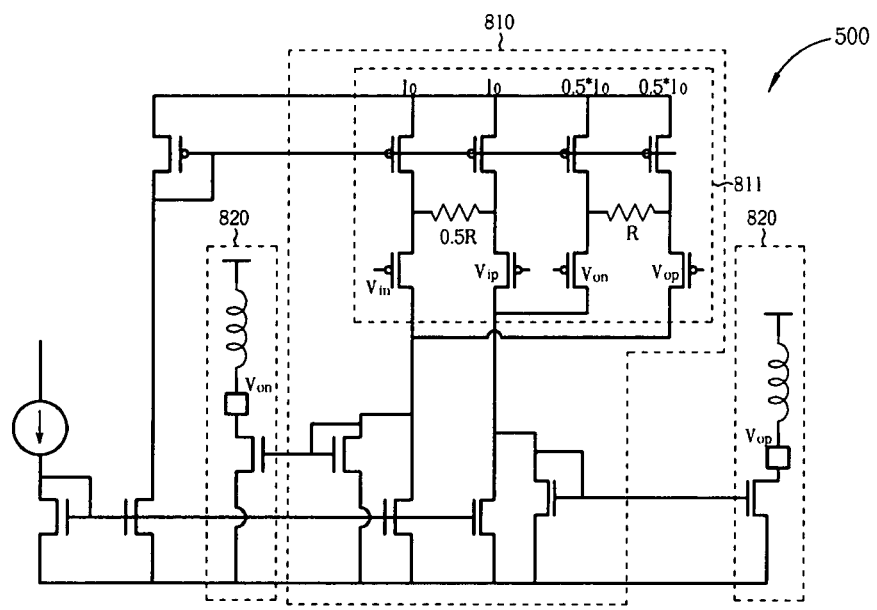
FIG. 8 is a diagram showing the other embodiment of a transmitter according to the present invention.

Please refer to FIG. 8, which is a diagram showing detailed circuits of a transmitter 500 of the other embodiment according to the present invention. Please note that, different from the embodiment shown in FIG. 7, in the transconductance cell 811, one resistor is implemented by a 0.5 R resistor. Therefore, the differential input signal only has to correspond to Vb(t). Obviously, because the input signal of the gain stage 810 only corresponds to Vb(t), the working voltage of the gain stage 810 only needs to correspondingly correspond to Vb(t). In other words, the gain stage 810 and the output stage 820 can share the same working voltage Vdd_1. In this embodiment, because the above-mentioned structure only needs the same working voltage, the transforming circuit for changing the voltage level of the working voltage is not utilized. This can further reduce the complexity of the entire circuit.

Please note that, similar to the embodiment shown in FIG. 7, in this embodiment, the transistor 812 is also an optional device. As mentioned previously, if parameters (e.g: the working voltage) can be set appropriately, the impedance device 812 is no longer utilized. And, the output of the transconductance cell 811 can be directly utilized to drive the output stage 820. This change is also obeys consistent with the spirit of the present invention.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A transmitter for transferring a transmission signal through a transmission medium, the transmitter comprising:
   a gain stage configured to receive an input signal and generate a first signal according to the input signal, wherein the gain stage comprises:
      a transconductance cell, configured to convert the input signal into a transconductance signal according to a transconductance of the transconductance cell; and
      an impedance unit, coupled to the transconductance cell, configured to receive the transconductance signal to output the first signal; and
   an output stage, coupled to the gain stage, configured to receive the first signal and output the transmission signal according to the first signal, wherein the output stage operates according to a first working voltage and the gain stage operates according to a second working voltage, wherein the first working voltage powers components in the output stage and the second working voltage powers components in the gain stage, and wherein the first working voltage is a lower value than the second working voltage; wherein a voltage level of the first working voltage is less than twice of the maximum of the transmission signal.

2. The transmitter of claim 1, wherein the impedance unit is implemented by a transistor.

3. The transmitter of claim 1, wherein the transconductance of the transconductance cell is substantially equal to 1/R, and R is an equivalent impedance of the transmission medium.

4. A method for transmitting a transmission signal through a transmission medium, the method comprising:
   providing a transconductance cell which receives an input signal and performs a transconductance operation on the input signal to generate a first signal, wherein a transconductance of the transconductance cell is substantially equal to 1/R, and R is equal to an equivalent impedance of the transmission medium; and
   providing an output stage which receives the first signal and outputs the transmission signal according to the first signal, wherein the output stage operates according to a first working voltage and the transconductance cell operates according to a second working voltage, wherein the first working voltage powers components in the output stage and the second working voltage powers components in the transconductance cell, and wherein the first working voltage is a lower value than the second working voltage;
   wherein a voltage level of the first working voltage is less than twice of the maximum of the transmission signal.

5. A transmitter for transferring a transmission signal through a transmission medium, the transmitter comprising:
   a gain stage configured to receive an input signal and generate a first signal according to the input signal, wherein the gain stage comprises a transconductance cell configured to convert the input signal into a transconductance signal according to a transconductance of the transconductance cell, wherein the gain stage further comprises an impedance unit, coupled to the transconductance cell, configured to receive the transconductance signal to output the first signal, wherein a transconductance of the transconductance cell is substantially equal to 1/R, and R is equal to an equivalent impedance of the transmission medium; and
   an output stage, coupled to the gain stage, configured to receive the first signal and output the transmission signal according to the first signal, wherein the output stage operates according to a first working voltage and the gain stage operates according to a second working voltage, wherein the first working voltage powers components in the output stage and the second working voltage powers components in the gain stage, and wherein the first working voltage is a lower value than the second working voltage.

6. A transmitter for transferring a transmission signal through a transmission medium, the transmitter comprising:
   a gain stage configured to receive an input signal and generate a first signal and a second signal according to the input signal, wherein the gain stage comprises a first input for receiving the input signal, a second input for receiving the transmission signal, and a first output for outputting the first signal, and a second output for outputting the second signal, wherein the gain stage comprises:
      a transconductance cell, configured to convert the input signal into a transconductance signal according to a transconductance of the transconductance cell; and
      an impedance unit, coupled to the transconductance cell, configured to receive the transconductance signal to output the first signal; and
   an output stage configured to receive the first signal and the second signal and output the transmission signal according to the first signal and the second signal, wherein the output stage comprising a first transistor for receiving the first signal and a second transistor for receiving the second signal, and a connection node of the first transistor and the second transistor for outputting the transmission signal;
   wherein the output stage operates according to a first working voltage and the gain stage operates according to a second working voltage, wherein the first working voltage powers components in the output stage and the second working voltage powers components in the gain stage, and wherein the first working voltage is a lower value than the second working voltage.

\* \* \* \* \*